(12) United States Patent
Chen

(10) Patent No.: US 10,211,363 B2
(45) Date of Patent: Feb. 19, 2019

(54) TRANSFER PRINTING TEMPLATE AND TRANSFER PRINTING DEVICE OF MICRO LIGHT-EMITTING DIODE

(71) Applicant: Shenzhen China Star Optoelectronics Technology Co., Ltd., Shenzhen, Guangdong (CN)

(72) Inventor: Lixuan Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 58 days.

(21) Appl. No.: 15/515,148

(22) PCT Filed: Mar. 7, 2017

(86) PCT No.: PCT/CN2017/075842
§ 371 (c)(1),
(2) Date: Mar. 28, 2017

(87) PCT Pub. No.: WO2018/152867
PCT Pub. Date: Aug. 30, 2018

(65) Prior Publication Data
US 2018/0240932 A1    Aug. 23, 2018

(51) Int. Cl.
*H01L 27/15* (2006.01)
*H01L 33/00* (2010.01)
(Continued)

(52) U.S. Cl.
CPC .......... *H01L 33/005* (2013.01); *H01L 33/08* (2013.01); *H01L 33/645* (2013.01); *H01L 2933/0033* (2013.01); *H01L 2933/0075* (2013.01)

(58) Field of Classification Search
CPC ..... H01L 2933/0033; H01L 2933/0075; H01L 33/005; H01L 33/08; H01L 33/645
See application file for complete search history.

(56) References Cited

U.S. PATENT DOCUMENTS

2014/0151733 A1* 6/2014 Koike .................. G03F 7/0002
257/98
2016/0086855 A1   3/2016 Bower

FOREIGN PATENT DOCUMENTS

CN        104067381 A    9/2014
CN        104600016 A    5/2015
(Continued)

*Primary Examiner* — Robert G Bachner
(74) *Attorney, Agent, or Firm* — Andrew C. Cheng

(57) ABSTRACT

This disclosure provides a transfer printing template, including a transfer substrate, one surface of the substrate has a array of bulges, the bulge surface and gap between the bulges are covered with a colloid varying its viscosity with temperature change. This disclosure also provides a transfer printing device of μLED, including a rack, the rack is provided with a standby platform and a transfer platform. A transfer mechanism is provided above the rack, can move between the two platforms and be vertically movable, the template is arranged on the mechanism, the bulges are disposed opposite to the two platforms. A device for heating the template is arranged on the mechanism, the template is fixed on the device by fasteners; a cooling device is provided in the transfer platform. Compared with the prior art, the transfer of μLED by adjusting temperature can be achieved, is a simple structure and high efficiency.

12 Claims, 3 Drawing Sheets

(51) Int. Cl.
*H01L 33/08* (2010.01)
*H01L 33/64* (2010.01)

(56) References Cited

FOREIGN PATENT DOCUMENTS

| | | | |
|---|---|---|---|
| CN | 105027259 | A | 11/2015 |
| CN | 105129259 | A | 12/2015 |
| CN | 105372864 | A | 3/2016 |
| CN | 105609447 | A | 5/2016 |
| CN | 105609455 | A | 5/2016 |
| CN | 105632985 | A | 6/2016 |
| CN | 105789245 | A | 7/2016 |
| CN | 106057723 | A | 10/2016 |
| CN | 106058010 | A | 10/2016 |
| CN | 205920952 | U | 2/2017 |
| CN | 106847862 | A | 6/2017 |
| JP | 66-151551 | A | 5/1994 |
| JP | 8-159662 | A | 6/1996 |
| JP | 2010-205828 | A | 9/2010 |
| JP | 2013-84683 | A | 5/2013 |
| KR | 100986248 | B1 | 10/2010 |

\* cited by examiner

TRANSFER PRINTING TEMPLATE AND TRANSFER PRINTING DEVICE OF MICRO LIGHT-EMITTING DIODE

TECHNICAL FIELD

This disclosure relates to a micro light-emitting diode display technology, especially a kind of micro light-emitting diode transfer printing device.

DESCRIPTION OF RELATED ART

Flat-panel display device becomes mainstream of display device due to its advantages of high-definition, power-saving, thin body and wide scope of application, are widely used in mobile phones, televisions, personal digital assistants, digital cameras, notebook computers, desktop computers and other consumer electronics products.

Micro light-emitting diode (Micro LED, μLED) display is a display on a substrate in a high density integrated micro-sized LED array as a display pixel to achieve the image display, as same as a large outdoor light-emitting diode display, each pixel is addressable, individually driven lighting, can be seen as a smaller version of the outdoor light-emitting diode display, the pixel distance reduced from millimeter to micron level; μLED displays and organic light-emitting diode (OLED) displays are all as part of self-luminous display. However, compared to OLED displays, μLED display has better material stability and longer lifetime, no image sticking, are considered as the biggest rival of OLED displays. Micro Transfer Printing technology is currently the main method for preparing μLED display device, the specific preparation process: first, grow μLED on a sapphire substrate, then by laser lift-off (LLO) technique, separated a μLED bare chip from the sapphire substrate, and then using a patterned Polydimethylsiloxane (PDMS) transfer head adsorbs the μLED bare chips from the sapphire substrate, and align the PDMS transfer head with the receiving substrate, then attach the μLED bare chip which PDMS transfer head adsorbed to a preset location on the receiving substrate, then peel the PDMS transfer head, to complete the transfer of the μLED bare chip to the receiver substrate, thereby to obtain μLED display device.

At present, the general method is to use energized adsorption or adhesion method of PDMS for transfer printing. When using PDMS way for peeling, it is a difficult to control the peeling effect; when using energized adsorption, it requires to conduct each suction head, and it is not only complex but also ineffective-peeling; currently, there is a technique by using temperature control to the transfer printing of μLED, its principle is by low temperature fugitive colloid, its transfer process is divided into adsorption-transfer-cooling and finish the transfer printing, both of the above transfer printing method is not only complicated and inefficient.

SUMMARY

To overcome the deficiencies of the prior art, this disclosure provides a transfer printing template and a transfer printing device of μLED, is not only a simple structure but also high transfer efficiency.

This disclosure provides a transfer printing template, including a transfer substrate, surface of one side of the transfer substrate has a uniform array of bulges, surface of the bulges and gap between the bulges are covered with a colloid varying its viscosity with temperature change.

Further, the shape of bulges is rectangular.

Further, the gap distance between the bulges is equal.

This disclosure also provides a transfer printing device of μLED including a rack, the rack is provided with a standby platform and a transfer platform adjacent to the standby platform. a transfer mechanism is provided above the rack, can move from the standby platform to the transfer platform and be vertically movable, the transfer printing template is arranged on the transfer mechanism, the bulges are disposed opposite to the standby platform and the transfer platform. The heating device for heating the transfer printing template is arranged on the transfer mechanism, a heating surface of the heating device faces downward, the transfer printing template is fixed on the heating surface of the heating device by fasteners, a cooling device for cooling the transfer printing template is provided in the transfer platform, the cooling surface is opposite to the heating surface. The power supply is arranged on the rack, the power is supplied respectively to heating device, cooling device and transfer mechanism.

Further, the shape of the bulges is rectangular.

Further, the gap distance between the bulges is equal.

Further, a guide rail provided on the rack and located above the standby platform and the transfer platform, a first transmission mechanism for driving the heating device and the horizontal movement of the transfer printing template and a second transmission mechanism for driving the heating device and the vertical movement of the transfer printing template, the second transmission mechanism is fixed connection with a slide of the guide rail 15.

Further, the first transmission mechanism includes wheels provided at both ends of the guide rail, the wheel axis is perpendicular to the guide rail, one of the wheels is provided with a drive motor, there are sets of belts on the two wheels, the second transmission mechanism is connected with belts by fixed blocks.

Further, the second transmission mechanism is a cylinder, the axis of the piston rod of the cylinder is perpendicular to the guide rail, and heating device is provided at the lower end of the piston rod.

Compared with the prior art, by providing the colloid varying its viscosity with temperature change on the transfer substrate and the matching transfer printing device, this disclosure achieves the transfer printing of μLEDs by temperature regulation, and is not only a simple structure but also high transfer efficiency.

BRIEF DESCRIPTION

DETAILED DESCRIPTION OF EMBODIMENTS

This disclosure is described in detail below in conjunction with the accompanying drawings and the embodiments.

Figure 1:
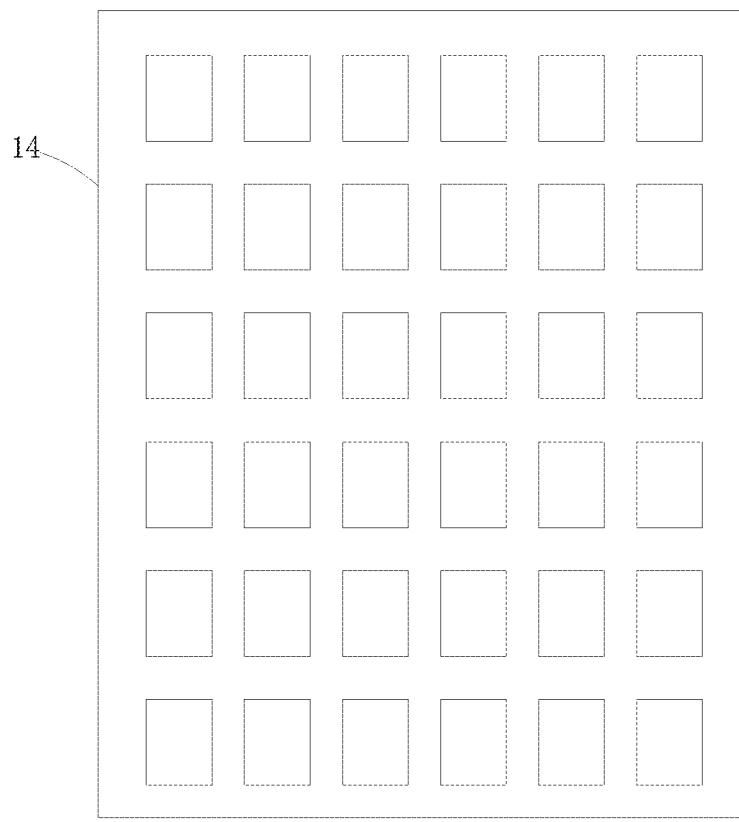
FIG. 1 is a schematic view of the transfer printing template of this disclosure.
Figure 2:
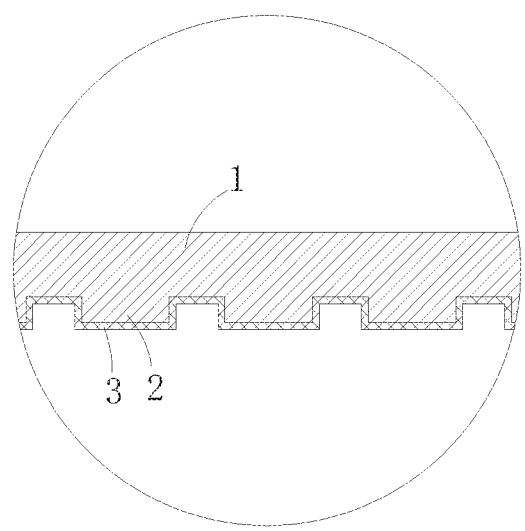
FIG. 2 is a schematic view of the internal structure of the transfer printing template of this disclosure.

As shown in FIG. 1 and FIG. 2, the transfer printing template 14 of this disclosure includes a plate-shaped transfer substrate 1, there is a uniform array of bulges 2 on one surface side of the transfer substrate, the surface of the bulges 2 and the gap between the bulges 2 are covered with temperature-control colloid 3 varying its viscosity with temperature change. The temperature-controlled colloid 3 is temperature-control one which can be peeled at low temperature, and the colloid loses its viscosity and can be peeled off at a temperature between 20-60° C.

In particular, the shape of the bulges 2 is rectangular with surface size is adapted to the size of the μLED of the supply substrate 11; the gap distance between the bulges 2 is equal; particularly, the gap distance between the bulges 2 is equal to the gap distance between two μLEDs on the supply substrate 11, to achieve adsorption.

The transfer substrate of this disclosure is made of a flexible material, such as PDMS (polydimethylsiloxane), PI (Polyimide) or PET (Polyethylene terephthalate).

Figure 3:
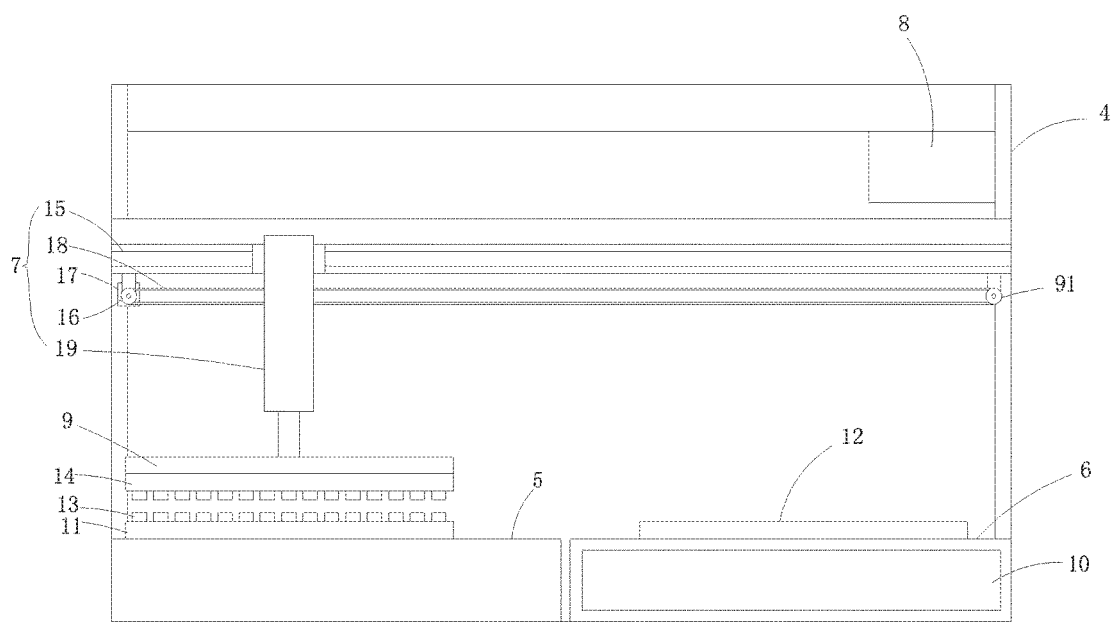
FIG. 3 is a schematic view of the transfer printing template of μLED of this disclosure.

As shown in FIG. 3, this disclosure also discloses a μLED transfer printing device includes a rack 4, provided with a standby platform 5 and a transfer platform 6 adjacent to standby platform 5; standby platform 5 is used for loading the supply substrate 11, and the transfer platform 6 is used for loading a receiving substrate 12; Above the rack is provided with the transmission mechanism 7, which can be move horizontally from the standby platform 5 to the transfer platform 6; the transmission mechanism 7 is provided with the transfer printing template 14; the transfer printing template 14 includes a plate-shaped transfer substrate (as shown in FIGS. 1 and 2); there is a uniform array of bulges 2 on one surface side of the transfer substrate, the bulges 2 is opposite to surface of the standby platform 5 and the transfer platform 6; surface of the bulges 2 and the gap between bulges 2 are covered with temperature-control colloid 3 varying its viscosity with temperature change; the temperature-controlled colloid 3 is temperature-control one which can be peeled at low temperature, and the colloid losses its viscosity and can be peeled off at temperature between 20-60° C.

The rack 7 is provided with heating device for heating the transfer printing template 14, the heating surface of the heating device 9 faces downward; the transfer printing template 14 is fixed on the heating surface of the heating device 9 by fasteners; the transfer platform 6 is provided with the cooling device for cooling the transfer printing template 14, the cooling surface of transfer platform 6 is opposite to the heating surface; the power supply 8 is arranged on the rack 4, which is supplied respectively to the heating device 9, the cooling device 10 and transfer mechanism 7.

The transfer printing template 14 of this disclosure is fixed with the heating device 9 by bolts or cards (not shown).

In the μLED transfer printing device of this disclosure, the shape of the bulges 2 is rectangular with surface size is adapted with the size of the μLED of the supply substrate 11; the gap distance between the bulges 2 is equal; particularly, the gap distance between the bulges 2 is equal to the gap distance between two μLEDs on the substrate 11, to achieve adsorption.

As shown in FIG. 3, the transfer mechanism 7 includes a guide rail 15 provided on the rack 4 and located above the standby platform 5 and the transfer platform 6, the first transmission mechanism for driving the heating device 9 and the horizontal movement of the transfer printing template 14 and the second transmission mechanism for driving the heating device 9 and the vertical movement of the transfer printing template 14, the second transmission mechanism is fixed connection with a slide of the guide rail 15.

In this disclosure, the first transmission mechanism and the second transmission mechanism can achieve the horizontal and vertical movement via the prior art such as the transmission of transmission belts, gear rack, and screw rotation.

As shown in FIG. 3, as an example of the first transmission mechanism, the first transmission mechanism includes the wheels 16 provided at both ends of the guide rail, and the axis of the wheels 16 is vertical to the guide rail, one of the wheels 16 is provided with drive motor 17, there are sets of bets on the wheels 16; the second transmission mechanism is connected with the belt 18 by fixed block; the two wheels 16 are fixed on the rack 4 by two L-shaped mounting bracket; the drive motor 17 is connected to the power supply 8.

As shown in FIG. 3, as an example of the second transmission mechanism, the second transmission mechanism of this disclosure is the cylinder 19, the shaft axis of the cylinder 19 is vertical to the guide rail 15, the block of the cylinder 19 is fixed connection with the slide of the guide rail 15 and transmission belt 18, the connection of the cylinder 19 and the transmission belt 18 in particular is connected to the upper side or lower side of the belt 18; the heating device 9 is disposed at the lower end of the piston rod of the cylinder 19.

Working principle of this disclosure is as follows: by the first transmission mechanism, the heating device 9 and transfer printing template 14 are moved horizontally above the standby platform 5, the heating device 9 is turned on to heat the transfer printing template 14, so that the viscosity of the tempture-control collide 3 becomes larger; the heating device 9 and the transfer printing template 14 are driven by the second transmission mechanism drives to move downward; after the transfer printing template 14 attaches the μLED from the supply substrate 11, the heating device 9 and the transfer printing template 14 are driven by the second transmission mechanism to move upward, and are moved above the transfer platform 6 by the first transmission mechanism; the heating device 9 and the transfer printing template 14 are driven by the second transmission mechanism to move downward; at this moment, the cooling device 10 is turned on and the heating device is turned off. When the transfer printing template 14 is moved downward to the top of the receiving substrate 12, the viscosity of the temperature-controlled colloid was reduced due to the reduction of temperature, so that the μLED 13 can be peeled from the transfer printing template 14, to complete the transfer of μLED 13.

According to this principle, the heating device 9 and the cooling device 10 of this disclosure may be reversed according to temperature properties of the temperature-controlled colloid 3, that is, if the temperature-controlled colloid 3 is heating peeled colloid, the peeling can be processed at 30-50° C.; at this time, the setting positions of the heating device 9 and the cooling device 10 are opposite, that is, the cooling device 10 is provided on the transmission mechanism 7, and the heating device 9 is provided on the transfer platform 6.

Figure 4:
FIG. 4 is a schematic view of the heating device of this disclosure.

The heating device of this disclosure may be employed in heating platforms of the prior art, such as the thermostatic heating platform; or the following manner can be used to achieve as shown in FIG. 4, includes a metal plate 20 having a heating surface, the metal plate 20 is provided with a PTC heating film 21; the PTC heating film 21 is powered by the power supply 8, then heat is generated from the PTC heating film 21 and conducted to the transfer printing template through the metal plate 20, so that the temperature-controlled colloid 3 is melted to attach the μLED 13.

Figure 5:
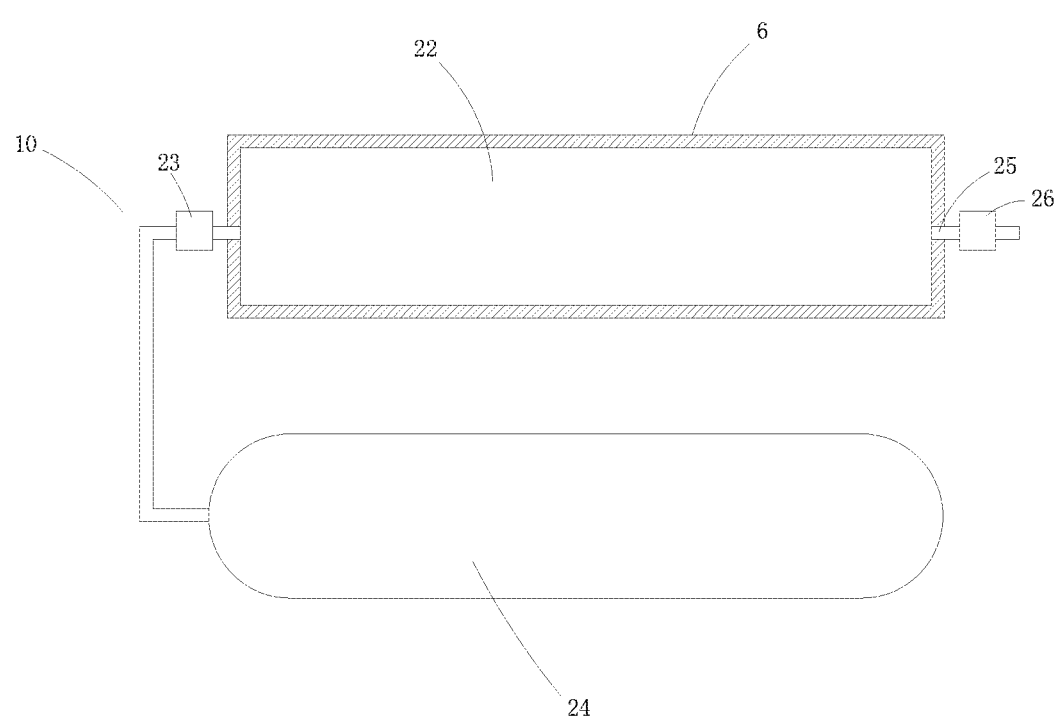
FIG. 5 is a schematic view of the cooling device of this disclosure.

The cooling device for this disclosure can be employed by the ones as shown in FIG. 5, includes a metal container 22, which can be loaded with a cooling medium; the section of the metal container 22 is rectangular, the metal container 22 constitutes the transfer platform 6, the cooling surface in the opposite side of the heating device is formed; the metal container 22 is loaded with a cooling medium, the cavity of the metal container 22 is connected to a storage tank 24 filled with a cooling medium through the first solenoid valve 23, the metal container 22 also has a exhaust port 25, the exhaust port 25 is provided with the second solenoid valve 27. When the transfer printing template adhered to μLED arrives to the top of the receiving substrate 12 on the cooling surface of the transfer platform 6, the receiving substrate 12 is cooled by cooling surface, the cooling temperature was conducted to the temperature-controlled colloid 3 through μLED, the viscosity of the temperature-controlled colloid 3 is reduced, so that the μLED 13 is peeled from transfer printing template to achieve transfer printing; the first solenoid valve 23 and the second solenoid valve 27 are all connected to the power supply 8.

In this disclosure, the cooling medium is liquid nitrogen or dry ice.

This disclosure can also be provided with a PLC (programmable logic) for controlling the operation of parts such as the heating device 9, the cooling device 10, and the transfer mechanism 7.

Although the disclosure has been described with reference to a particular embodiment, those skilled in the art will understand that a number of variations may be made in form and detail without departing from the spirit and scope of the appended claims and their equivalents of this disclosure.

What is claimed is:

1. A transfer printing device of micro light-emitting diode (μLED), comprising: a rack, the rack is provided with a standby platform and a transfer platform adjacent to the standby platform, a transfer mechanism is provided above the rack, can move from the standby platform to the transfer platform and be vertically movable, a transfer printing template is arranged on the transfer mechanism, the transfer template comprises a transfer substrate, there is an uniform array of bulges on one side surface of the transfer substrate, surface of the bulges and gap between the bulges are covered with colloid varying its viscosity with temperature change, the bulges are disposed oppositely to the standby platform and the transfer platform, a heating device for heating the transfer printing template is arranged on the transfer mechanism, a heating surface of the heating device faces downward, the transfer printing template is fixed on the heating surface of the heating device by fasteners, a cooling device for cooling the transfer printing template is provided in the transfer platform the cooling surface is opposite to the heating surface, a power supply is arranged on the rack, the power is supplied respectively to the heating device, the cooling device and the transfer mechanism.

2. The transfer printing device of μLED according to claim 1, wherein the shape of the bulges is rectangular.

3. The transfer printing device of μLED according to claim 1, wherein the gap distance between the bulges is equal.

4. The transfer printing device of μLED according to claim 1, wherein the transfer mechanism comprises a guide rail provided on the rack and located above the standby platform and the transfer platform, a first transmission mechanism for driving the heating device and the horizontal movement of the transfer printing template and a second transmission mechanism for driving the heating device and the vertical movement of the transfer printing template, the second transmission mechanism is fixed connection with a slide of the guide rail.

5. The transfer printing device of μLED according to claim 2, wherein the transfer mechanism comprises a guide rail provided on the rack and located above the standby platform and the transfer platform, a first transmission mechanism for driving the heating device and the horizontal movement of the transfer printing template and a second transmission mechanism for driving the heating device and the vertical movement of the transfer printing template, the second transmission mechanism is fixed connection with a slide of the guide rail.

6. The transfer printing device of μLED according to claim 3, wherein the transfer mechanism comprises a guide rail provided on the rack and located above the standby platform and the transfer platform, a first transmission mechanism for driving the heating device and the horizontal movement of the transfer printing template and a second transmission mechanism for driving the heating device and the vertical movement of the transfer printing template, the second transmission mechanism is fixed connection with a slide of the guide rail.

7. The transfer printing device of μLED according to claim 4, wherein the first transmission mechanism comprises wheels provided at both ends of the guide rail, the wheel axis is perpendicular to the guide rail, one of the wheels is provided with a drive motor, the two wheels are provided with a belt, and the second transmission mechanism is connected to the belt by a fixed block.

8. The transfer printing device of μLED according to claim 5, wherein the first transmission mechanism comprises wheels provided at both ends of the guide rail, the wheel axis is perpendicular to the guide rail, one of the wheels is provided with a drive motor, the two wheels are provided with a belt, and the second transmission mechanism is connected to the belt by a fixed block.

9. The transfer printing device of μLED according to claim 6, wherein the first transmission mechanism comprises wheels provided at both ends of the guide rail, the wheel axis is perpendicular to the guide rail, one of the wheels is provided with a drive motor, the two wheels are provided with a belt, and the second transmission mechanism is connected to the belt by a fixed block.

10. The transfer printing device of μLED according to claim 7, wherein the second transfer mechanism is a cylinder, the axis of the piston rod of the cylinder is perpendicular to the guide rail, and the heating device is provided at the lower end of the piston rod of the cylinder.

11. The transfer printing device of μLED according to claim 8, wherein the second transfer mechanism is a cylinder, the axis of the piston rod of the cylinder is perpendicular to the guide rail, and the heating device is provided at the lower end of the piston rod of the cylinder.

12. The transfer printing device of the μLED according to claim 9, wherein the second transfer mechanism is a cylinder, the axis of the piston rod of the cylinder is perpendicular to the guide rail, and the heating device is provided at the lower end of the piston rod of the cylinder.

* * * * *